(12) United States Patent
Kawamura et al.

(10) Patent No.: US 11,852,548 B2
(45) Date of Patent: Dec. 26, 2023

(54) SWITCH

(71) Applicants: Takashi Kawamura, Tokyo (JP); Yoichi Yasunaga, Tokyo (JP); Takeshi Higaki, Tokyo (JP); Toshihiko Terashita, Tokyo (JP); Shintaro Ogura, Tokyo (JP); Shigenori Inamoto, Tokyo (JP); Yuki Takahashi, Tokyo (JP); Kotaro Eguchi, Nagano (JP); Kui Li, Nagano (JP); Satoshi Sato, Nagano (JP)

(72) Inventors: Takashi Kawamura, Tokyo (JP); Yoichi Yasunaga, Tokyo (JP); Takeshi Higaki, Tokyo (JP); Toshihiko Terashita, Tokyo (JP); Shintaro Ogura, Tokyo (JP); Shigenori Inamoto, Tokyo (JP); Yuki Takahashi, Tokyo (JP); Kotaro Eguchi, Nagano (JP); Kui Li, Nagano (JP); Satoshi Sato, Nagano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 678 days.

(21) Appl. No.: 17/047,512

(22) PCT Filed: Apr. 17, 2019

(86) PCT No.: PCT/JP2019/016525
§ 371 (c)(1),
(2) Date: Oct. 14, 2020

(87) PCT Pub. No.: WO2019/208367
PCT Pub. Date: Oct. 31, 2019

(65) Prior Publication Data
US 2021/0156753 A1 May 27, 2021

(30) Foreign Application Priority Data
Apr. 26, 2018 (JP) ................. 2018-085637

(51) Int. Cl.
*G01L 1/00* (2006.01)
*G01L 1/22* (2006.01)
(Continued)

(52) U.S. Cl.
CPC .................. *G01L 1/22* (2013.01); *G05G 1/02* (2013.01); *G05G 5/05* (2013.01); *G05G 2505/00* (2013.01);
(Continued)

(58) Field of Classification Search
CPC ... G01L 1/22; G05G 1/02; G05G 5/05; G05G 2505/00; H01H 13/14; H01H 2215/004; H01H 2239/052
(Continued)

(56) References Cited

U.S. PATENT DOCUMENTS 5,909,804 A * 6/1999 Kuratani .............. H01H 13/705
200/406
6,293,160 B1 * 9/2001 Shigemoto ............ G06F 3/0338
73/862.632
(Continued)

FOREIGN PATENT DOCUMENTS

JP S62-208517 9/1987
JP S63-179619 U 11/1988
(Continued)

OTHER PUBLICATIONS

International Search Report for PCT/JP2019/016525 dated Jul. 2, 2019.

*Primary Examiner* — Max H Noori
(74) *Attorney, Agent, or Firm* — IPUSA, PLLC

(57) ABSTRACT

A switch according to the present invention includes a base including a recessed portion on one surface of the base; a click spring having a dome shape, the click spring being provided at the recessed portion such that the bottom of the recessed portion is contacted at a dome-shaped opening side of the click spring; a cover provided to cover the recessed portion and to house the click spring at the recessed portion; and a strain detecting element attached to another surface of (Continued)

the base. The strain detecting element is configured to detect strain of the base, the strain occurring in accordance with a depression amount of the click spring that is depressed.

11 Claims, 15 Drawing Sheets

(51) Int. Cl.
*G05G 1/02* (2006.01)
*G05G 5/05* (2006.01)
*H01H 13/14* (2006.01)

(52) U.S. Cl.
CPC ....... *H01H 13/14* (2013.01); *H01H 2215/004* (2013.01); *H01H 2239/052* (2013.01)

(58) Field of Classification Search
USPC .................................................... 73/862.628
See application file for complete search history.

(56) References Cited

U.S. PATENT DOCUMENTS

| | | | | |
|---|---|---|---|---|
| 11,686,598 | B2* | 6/2023 | Li | H03K 17/945 702/189 |
| 2003/0209418 | A1* | 11/2003 | Yanai | H01H 13/48 200/406 |
| 2003/0221943 | A1* | 12/2003 | Masuda | H01H 13/48 200/406 |
| 2004/0226810 | A1* | 11/2004 | Takata | H01H 21/24 200/339 |
| 2008/0296140 | A1 | 12/2008 | Yoshihara et al. | |
| 2011/0285662 | A1* | 11/2011 | Maenpaa | G06F 3/0338 345/174 |
| 2013/0044056 | A1* | 2/2013 | Kamentser | G06F 3/03543 345/163 |
| 2013/0292481 | A1* | 11/2013 | Filson | G05D 23/1902 236/1 C |
| 2015/0179367 | A1* | 6/2015 | Kodama | H01H 11/00 264/272.14 |
| 2016/0225551 | A1 | 8/2016 | Shedletsky | |
| 2023/0194365 | A1* | 6/2023 | Salvador Lou | G01B 7/18 73/862.628 |

FOREIGN PATENT DOCUMENTS

| | | |
|---|---|---|
| JP | 2004-213164 | 7/2004 |
| JP | 2009-016330 | 1/2009 |
| JP | 2010-015793 | 1/2010 |
| JP | 2016-027533 | 2/2016 |

* cited by examiner

SWITCH

TECHNICAL FIELD

The present invention relates to a switch.

BACKGROUND

Switches provided in electronic devices or the like include a plurality of fixing conductive members and a movable conductive member. Such a switch is configured such that the movable conductive member is displaced in accordance with a user's switching operation, and such that the switch is turned on or off in response to varying states of the plurality of fixing conductive members.

Switches in related art are described in Patent document 1, Patent document 2, and Patent document 3. Patent document 1 describes a device having a strain detecting element on a flat base on which a support member is disposed, where the device can be operated by the movable member that performs a press operation in a vertical direction.

Patent document 2 describes a device in which a fixing contact having a pressure-sensitive conductive sheet is provided on a substrate, where the device provides electrical connection or disconnection with a click feeling, through a press operation of a movable contact body that is a conductively thin metal plate, as well as detecting a change in a resistance value in accordance with a subsequent press force.

Patent document 3 describes a structure in which a pressure-sensitive conductive sensor is provided on a fixing contact, which is disposed on a substrate, where the structure includes a variety of switching functions based on an increase or decrease in a press force.

CITATION LIST

Patent Document

[Patent document 1] Japanese Unexamined Patent Application Publication No. 2004-213164
[Patent document 2] Japanese Unexamined Patent Application Publication No. 2009-16330
[Patent document 3] Japanese Unexamined Patent Application Publication No. 2010-15793
[Patent document 4] Japanese Unexamined Patent Application Publication No. 2016-27533

SUMMARY

However, the device described in Patent document 1 has the configuration in which the strain detecting element is provided directly on the base, and thus a process of providing the strain detecting element on the substrate is required. Accordingly, a manufacturing process is complicated. Further, the device in Patent document 2 or 3 has the configuration is which the pressure-sensitive conductive sheet or the pressure-sensitive conductive sensor is provided within the device. For the devices described above, the manufacturing processes are also complicated, and thus the devices are not easily manufactured.

In view of the point described above, an object of the present invention is to provide a switch that includes a strain detecting element and that can be easily manufactured.

A switch (100) according to one aspect of the present invention includes a base (110) including a recessed portion on one surface of the base; a click spring (120) having a dome shape, the click spring being provided at the recessed portion such that the bottom of the recessed portion is contacted at a dome-shaped opening side of the click spring; a cover (140) provided to cover the recessed portion and to house the click spring at the recessed portion; and a strain detecting element (150) attached to another surface of the base, wherein the strain detecting element is configured to detect strain of the base, the strain occurring in accordance with a depression amount of the click spring that is depressed.

Note that reference numerals in the parentheses indicated above are presented for ease of understanding of the aspect. The reference numerals are merely examples and are not limited to one or more aspects described below.

According to a disclosed technique, a configuration is which a strain detecting element is attached to the other surface of a base is provided and can be easily manufactured.

DETAILED DESCRIPTION

Hereafter, one or more embodiments of the invention will be described with reference to the drawings. In each drawing, the same components are denoted by the same numerals; accordingly, explanation for the components may be omitted.

Embodiment

An example of the preferred embodiment will be described below in detail with reference to the accompanying drawings. Note that in each drawing used in the following description, scales are varied as appropriate in order to make each member a recognizable size. The words "front and back," "left and right," and "up and down" are used for ease of explanation, and are not intended to limit a pose or direction in actual use.

Figure 1:
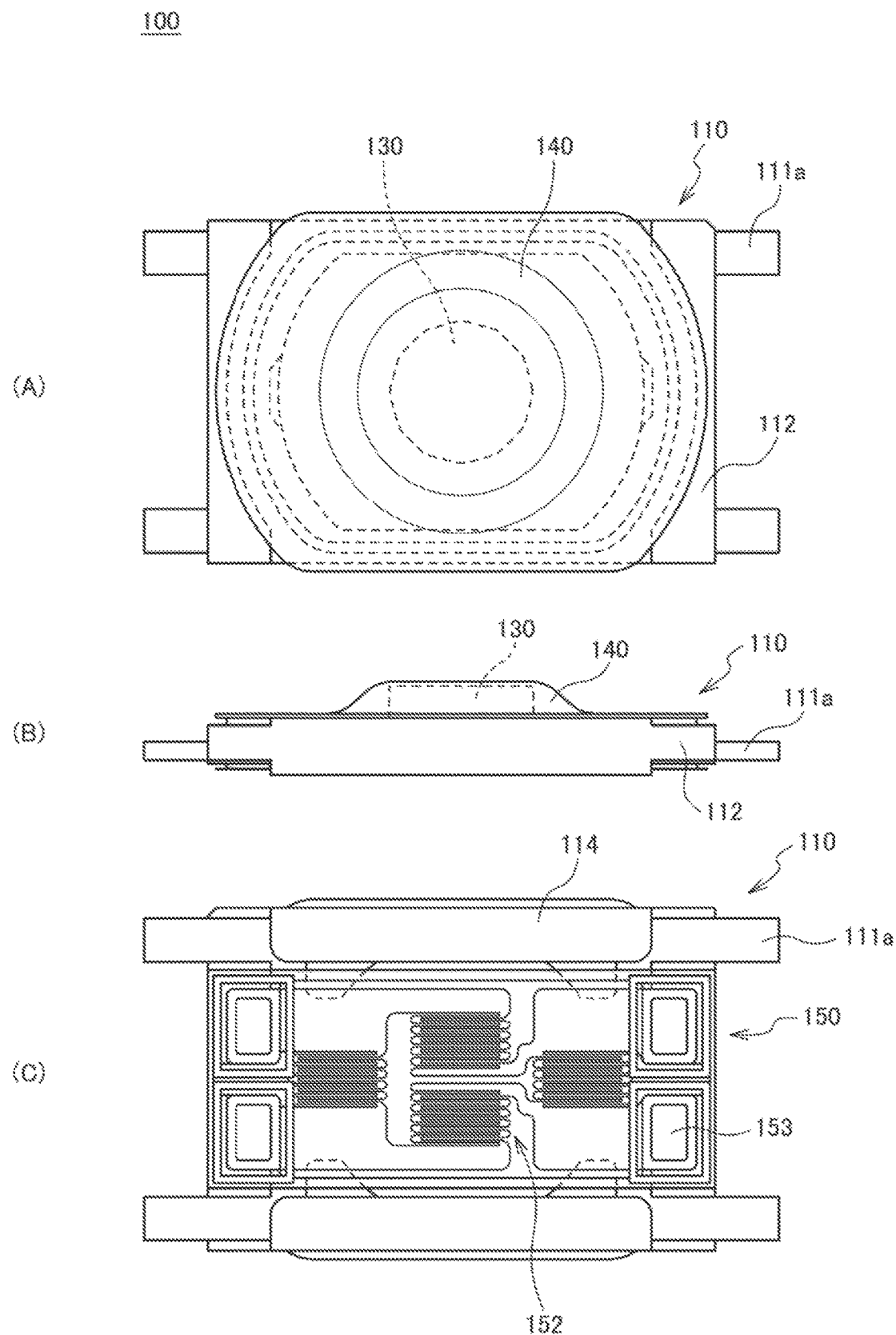
FIG. 1 relates to an upper surface-side plan view (A), a side view (B), and a lower surface-side plan view (C) of an example of a switch according to an embodiment.
Figure 2:
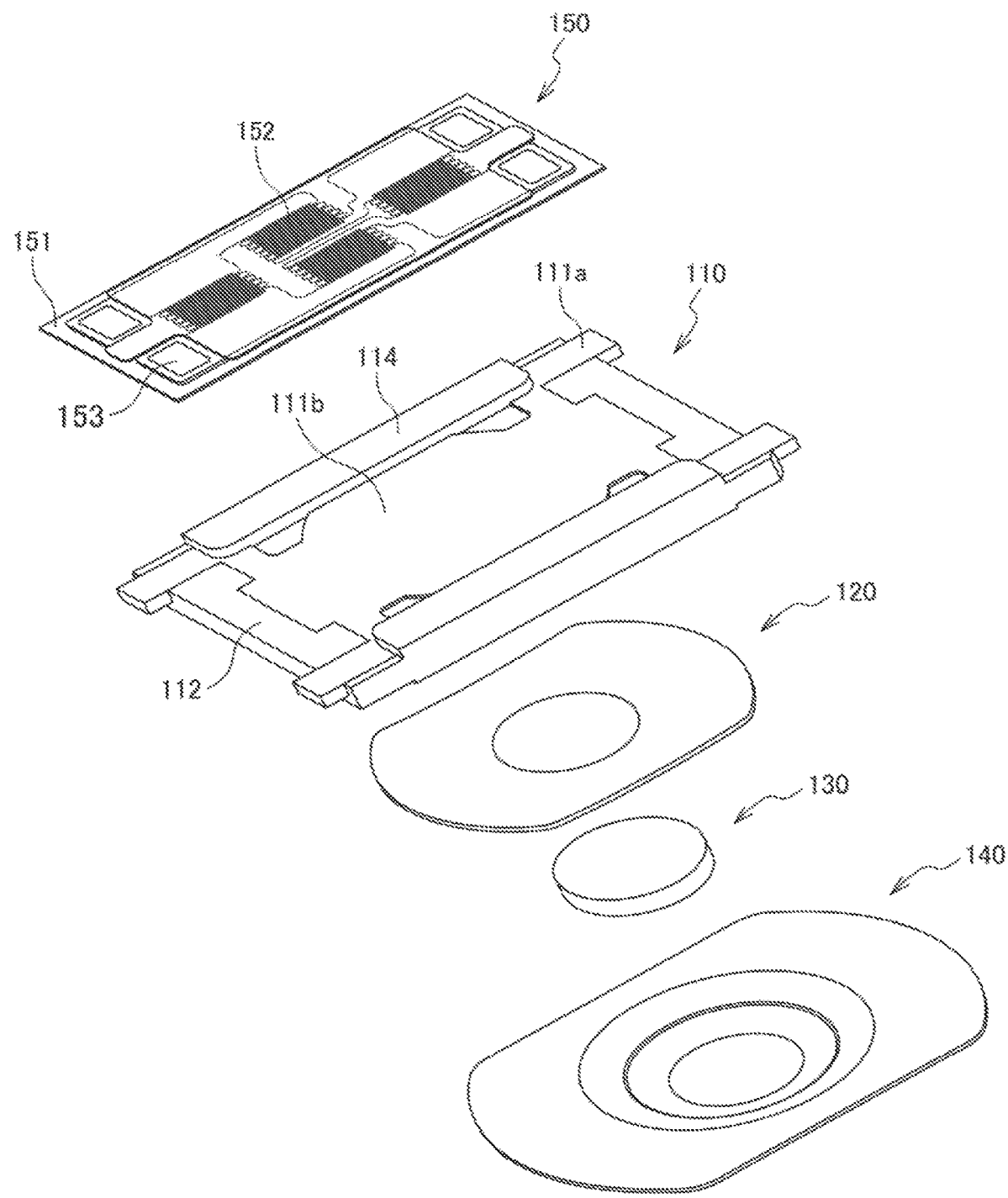
FIG. 2 is an exploded perspective view of an example of the switch according to the embodiment.
Figure 3:
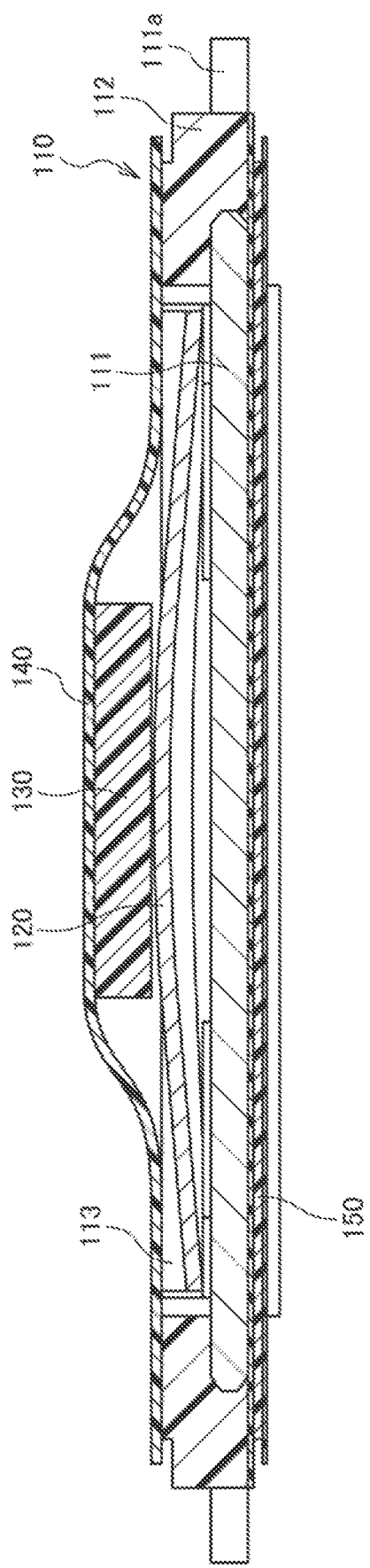
FIG. 3 is a cross-sectional view of an example of the switch according to the embodiment.

FIG. 1 relates to an upper surface-side plan view (A), a side view (B), and a lower surface-side plan view (C) of a push switch 100 that is an example of a switch according to the embodiment. FIG. 2 is an exploded perspective view of the push switch 100 that is an example of the switch according to the embodiment. FIG. 3 is a cross-sectional view of an example of the push switch according to the embodiment.

The push switch 100 includes a base 110, a click spring 120, an actuator 130, a cover 140, and a strain detecting element 150. The base 110 includes a conductive body 111 having terminals 111a and includes a resin portion 112, and is formed by insert molding. A recessed portion 113 is provided on one surface of the base 110. The click spring 120 has a dome shape and is disposed at the recessed portion 113, such that the bottom of the recessed portion. 113 is contacted at a dome-shaped opening side of the click spring. The cover 140 covers the recessed portion 113 and is provided so as to house the click spring 120 at the recessed portion 113. The actuator 130 is provided between a top of the click spring 120 and the cover 140. The strain detecting element 150 is configured such that strain gauges 152 and terminals 153 are provided on an element substrate 151. The strain detecting element 150 is attached to the other surface of the base 110 (surface opposite to the surface of the base on which the recessed portion 113 is provided). The strain detecting element 150 is also referred to as a strain sensor.

The above push switch 100 is connected and secured to a mounting board by solder or the like, at the terminals 111a of the base 110 and the terminals 153 of the strain detecting element 150. In the present embodiment, since signals are not transmitted and received via the terminals 111a of the base 110, the terminals 111a are used to secure the mounting board. The terminals 153 of the strain detecting element 150 are each connected to a measurement system via the mounting board, and a resistance value for each of the strain gauges 152 that is provided on the strain detecting element 150 is detected.

The push switch 100 has the configuration in which the strain detecting element 150 detects strain of the base 110, which occurs in accordance with a depression amount of the click spring 120 that is depressed. A user depresses the switch to thereby be able to depress the actuator 130 directly or indirectly via the cover 140. When the actuator 130 is depressed, the top of the dome-shaped click spring 120, which is at a center portion of the spring and is disposed below the actuator 130, is depressed. When a load exceeds a predetermined value, the center portion is turned down with a click feeling, so that the center portion is held in a state of protruding downward. From this time, strain occurs in the base 110 due to a force to depress the base 110, and the strain detecting element 150 starts actualizing detection accordingly. When the depression amount of the click spring 120 in accordance with the depression further increases, the force to depress the base 110 increases further, so that the resulting strain of the base 110 becomes even greater. The present embodiment is described using a configuration that does not provide, at the recessed portion 113 of the base 110, any contact that becomes in a state of being electrically conductive in response to depressing the click spring 120. An on state or an off state of the switch is identified based on the output of the strain detecting element 150.

Figure 4:
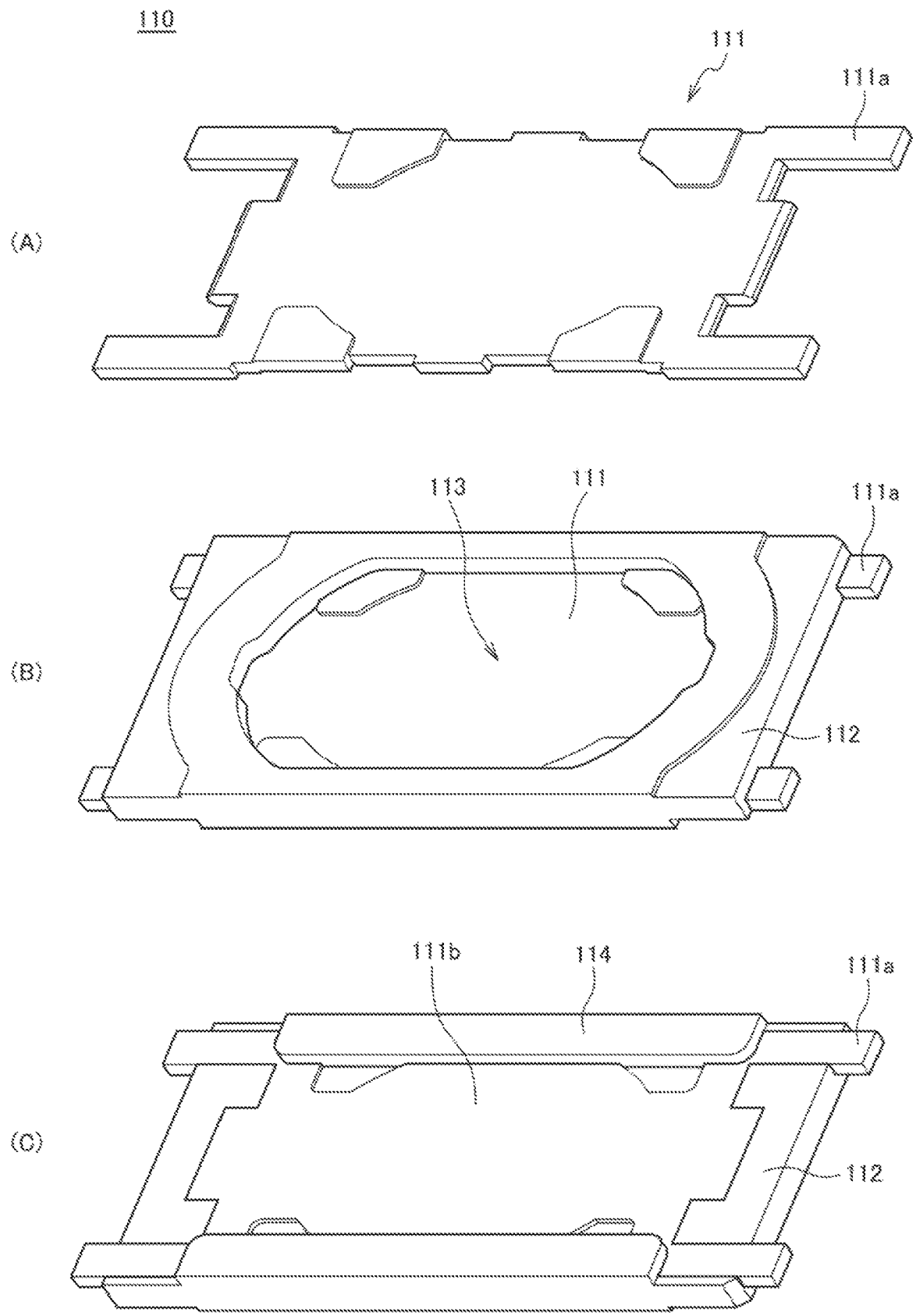
FIG. 4 is a perspective view of an example of the configuration of a base of the switch according to the embodiment.

FIG. 4 is a perspective view of an example of the configuration of the base of the switch according to the present embodiment. FIG. 4(A) is a perspective view of the conductive body 111 included in the base 110. The conductive body 111 is formed of stainless steel or other metal, having an approximately plate shape. The conductive body 111 includes the respective terminals 111a at four locations. The conductive body 111 is preferably formed of a ductile material. In such a configuration, strain occurring in the base 110 with the conductive body 111 can be effectively transferred to the strain detecting element 150.

FIG. 4(B) is an upper surface-side perspective view of the base 110. By insert molding, the conductive body ill is provided with the resin portion 112 formed of an insulating resin such as a polyamide resin. On one surface (upper surface) of the base 110, the recessed portion 113 of which the bottom is the upper surface of the conductive body 111, and of which sidewalls constitute part of the resin portion 112, is provided. For example, in a plan view, the base 110 has an approximately rectangular shape having a long side of 1 mm to several mm and a short side of 0.5 mm to several mm. The base 110 has a plate shape having a thickness of 0.1 mm to several mm. The recessed portion 113 has a size corresponding to the size of the base 110, and is approximately elongated or approximately elliptically shaped in a plan view. Here, the plan view specifies that the base 110 or the recessed portion 113 is viewed from the direction normal to the upper surface of the base 110.

FIG. 4(C) is a lower surface-side perspective view of the base 110. The resin portion 112 is provided so as to expose the other surface 111b of the conductive body 111. As a portion of the resin portion 112, a pair of protruding portions 114 is provided along a pair of opposing long sides of the approximately rectangular shaped base 110, on the other surface of the base 110. An inner wall surface of each protruding portion 114 constitutes part of a groove. The position of the outer periphery of the strain detecting element 150 is adjusted with respect to the inner wall surfaces of the respective grooves, so that the strain detecting element 150 is positioned with respect to the base 110.

Figure 5:
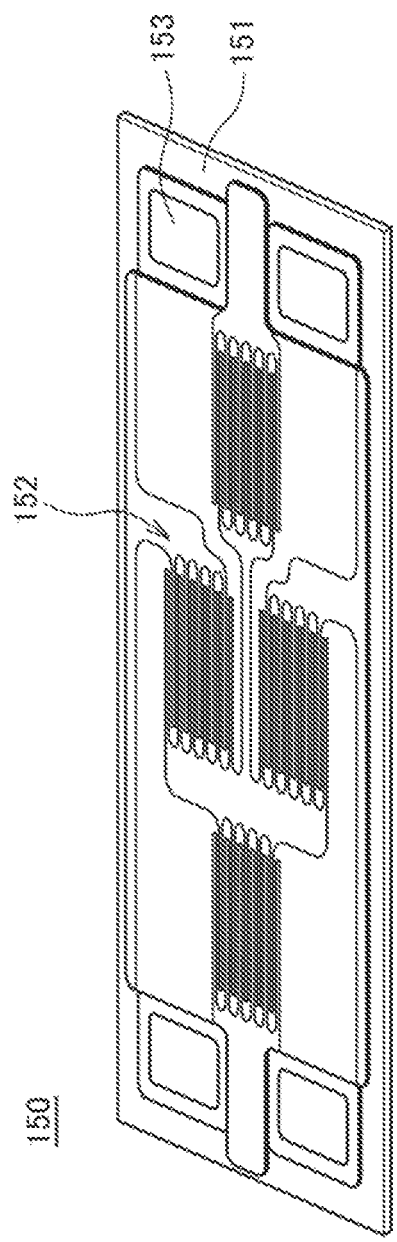
FIG. 5 is a perspective view of an example of a strain detecting element of the switch according to the embodiment.

FIG. 5 is a perspective view of an example of the strain detecting element of the switch according to the present embodiment. The strain gauges 152 and the terminals 153 are provided on the element substrate 151 that has the approximately rectangular shape in a plan view. In the drawing, the four strain gauges 152 are provided. However, one or more strain gauges may be provided. A direction in which each strain gauge detects strain is a direction in which a fine pattern of the strain gauge extends. In the drawing, the pattern in which the direction in which each of the four strain gauges detects strain is along the long side direction of the element substrate 151, is used. However, it is not limited to the pattern described above. A pattern in which the direction in which each of the four strain gauges detects strain is along the short side direction of the element substrate 151, or a pattern in which a pattern along the long side direction and a pattern along the short side direction are present together, may be used. In particular, when four strain gauges are used, a Wheatstone bridge can be constituted by the four strain gauges.

Figure 6:
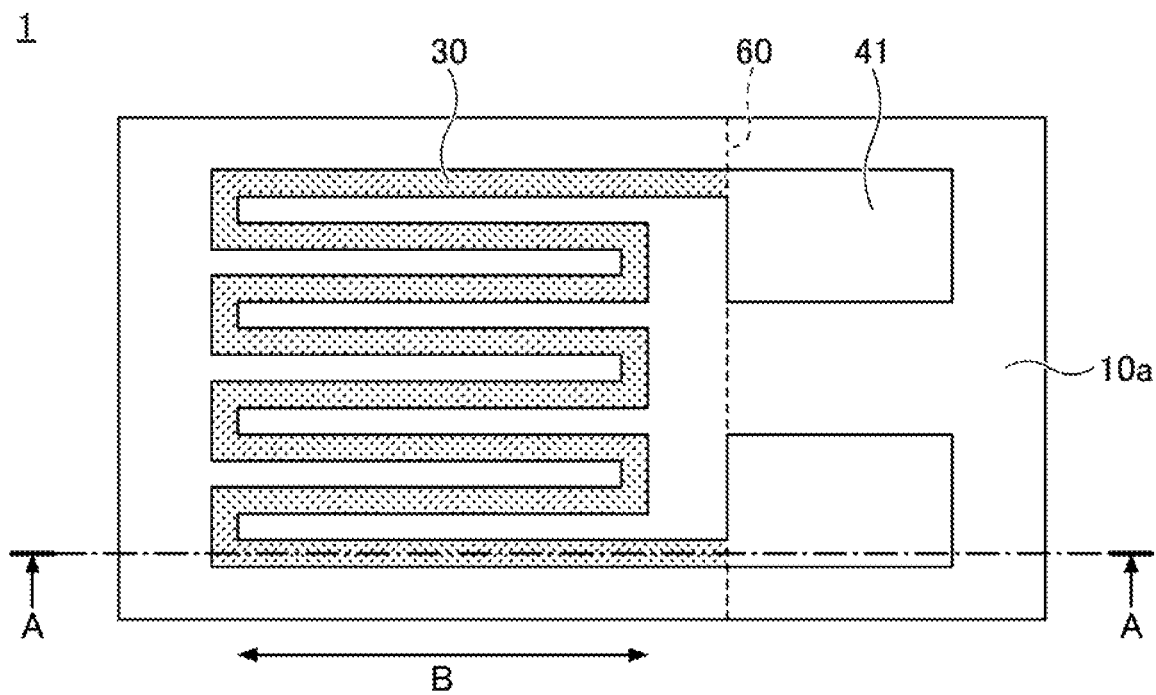
FIG. 6 is a plan view of an example of the strain detecting element of the switch according to the embodiment.
Figure 7:
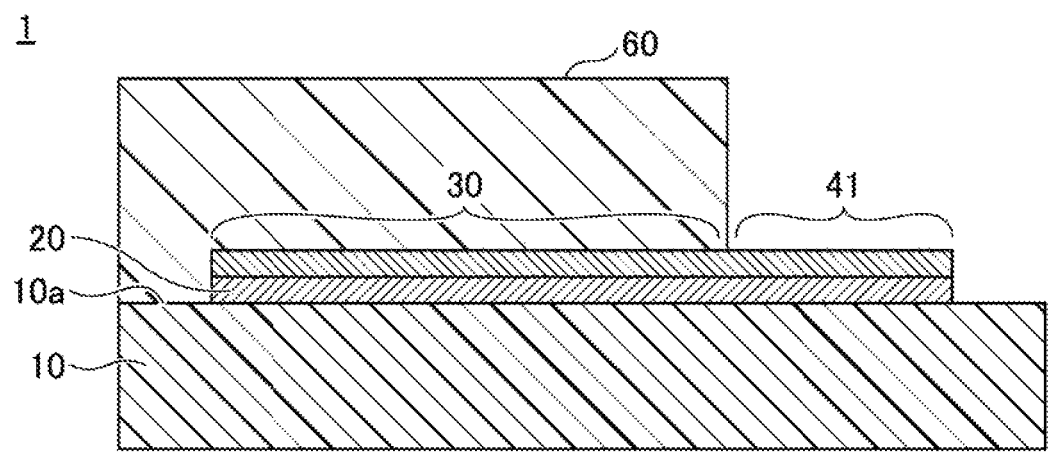
FIG. 7 is a cross-sectional view of an example of the strain detecting element of the switch according to the embodiment.

The strain gauge 152 will be described. In the following description, one strain gauge will be described as a representative example. FIG. 6 is a plan view of an example of the strain gauge according to the present embodiment. FIG. 7 is a cross-sectional view of the strain gauge according to a first embodiment, and illustrates a cross section taken along the A-A line in FIG. 6. Referring to FIGS. 6 and 7, a strain gauge 1 includes a substrate 10 that is the element substrate 151 described above, and includes a functional layer 20, a resistor 30, terminal sections 41, and a cover layer 60. Note that in FIG. 6, an outer edge of the cover layer 60 is only expressed by a dashed line in order to indicate the resistor 30, for the sake of convenience.

Note that in the present embodiment, for the sake of convenience, with respect to the strain gauge 1, the side of the substrate 10 where the resistor 30 is provided is referred to as an upper side or one side; and the side of the substrate 10 where the resistor 30 is not provided is referred to as a lower side or another side. Further, for each component, the surface on the side where the resistor 30 is provided is referred to as one surface or an upper surface; and the surface on the side where the resistor 30 is not provided is referred to as another surface or a lower surface. However, the strain gauge 1 can be used in a state of being upside down, or be disposed at any angle. Further, a plan view specifies that an object is viewed from a direction normal to an upper surface 10a of the substrate 10, and a planar shape refers to a shape of an object when viewed from the direction normal to the upper surface 10a of the substrate 10.

The substrate 10 is a member that is a base layer for forming the resistor 30 or the like and is flexible. The thickness of the substrate 10 is not particularly restricted, and can be appropriately selected for any purpose. For example, such a thickness can be approximately between 5 μm and 500 μm. In particular, when the thickness of the substrate 10 is between 5 μm and 200 μm, it is preferable in terms of strain transfer from a strain generating body surface that is bonded to a lower surface of the substrate 10 via an adhesive layer or the like; and dimensional stability with respect to environment, and when the thickness is 10 μm or more, it is further preferable in terms of insulation.

The substrate 10 can be formed of an insulating resin film such as a PI (polyimide) resin, an epoxy resin, a PEEK (polyether ether ketone) resin, a PEN (polyethylene naphthalate) resin, a PET (polyethylene terephthalate) resin, a PPS (polyphenylene sulfide) resin, or a polyolefin resin. Note that the film refers to a flexible member having a thickness of about 500 μm or less.

Here, the "formed of an insulating resin film" is not intended to preclude the substrate 10 from containing fillers, impurities, or the like in the insulating resin film. The substrate 10 may be formed of, for example, an insulating resin film containing fillers such as silica or alumina.

functional layer 20 is formed, as a lower layer of the resistor 30, on the upper surface 10a of the substrate 10. In other words, a planar shape of the functional layer 20 is approximately the same as the planar shape of the resistor 30 illustrated in FIG. 6. The thickness of the functional layer 22 can be approximately between 1 nm and 100 nm, for example. Note that the functional layer 20 is not an essential component, and can be omitted in some cases.

In the present application, the functional layer refers to a layer that has a function of promoting crystal growth of the resistor 30 that is at least an upper layer. The functional layer 20 preferably further has a function of preventing oxidation of the resistor 30 caused by oxygen and moisture contained in the substrate 10, as well as a function of improving adhesion between the substrate 10 and the resistor 30. The functional layer 20 may further have other functions.

An insulating resin film that constitutes the substrate 10 contains oxygen and moisture. In this regard, particularly when the resistor 30 includes Cr (chromium), it is effective for the functional layer 20 to have a function of preventing oxidation of the resistor 30, because Cr forms an autoxidized film.

The material of the functional layer 20 is riot particularly restricted as long as it is material having a function of promoting crystal growth of the resistor 30 that is at least an upper layer. Such material can be appropriately selected for any purpose, and includes one or more metals selected from the group consisting of, for example, Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (irdium), Pt (platinum), Pd (palladium), Ag (silver), Au (gold), Co (cobalt), Mn (manganese), and Al (aluminum); an alloy of any metals from among the group; or a compound of any metal from among the group.

Examples of the above alloy include FeCr, TiAl, FeNi, NiCr, CrCu, and the like. Examples of the above compound include TiN, TaN, $Si_3N_4$, $TiO_2$, $Ta_2O_5$, $SiO_2$, and the like.

The resistor 30 is a thin film formed in a predetermined pattern and above the upper surface of the functional layer 20, and is a sensitive section where resistance varies in accordance with strain. Note that in FIG. 6, for the sake of convenience, the resistor 30 is illustrated in a crepe pattern.

The resistor 30 can be formed of, for example, material including Cr (chromium), material including Ni (nickel), or material including both of Cr and Ni. In other words, the resistor 30 can be formed of material including at least one from among Cr and Ni. An example of the material including Cr includes a Cr composite film. An example of the material including nickel includes Cu—Ni (copper nickel). An example of the material including both of Cr and Ni includes Ni—Cr (nickel chromium).

Here, the Cr composite film is a composite film of Cr, CrN, $Cr_2N$, and the like. The Cr composite film may include incidental impurities such as chromium oxide. A portion of the material that constitutes the functional layer 20 may also be diffused into the Cr composite film. In this case, the material that constitutes the functional layer 20, and nitrogen may form a compound. For example, when the functional layer 20 is formed of Ti, the Cr composite film may include Ti or TiN (titanium nitride).

The thickness of the resistor 30 is not particularly restricted, and can be appropriately selected for any purpose. The thickness can be, for example, approximately between 0.05 μm and 2 μm. In particular, when the thickness of the resistor 30 is 0.1 μm or more, it is preferable in terms of improvement in crystallinity (e.g., crystallinity of α-Cr) of a crystal that constitutes the resistor 30, and when the thickness of the resistor 30 is 1 μm or less, it is further preferable in terms of reduction in cracks of a given film caused by internal stress of the film that constitutes the resistor 30, or reduction in warp in the substrate 10.

With the resistor 30 being formed on the functional layer 20, the resistor 30 can be formed by a stable crystalline phase and thus stability of gauge characteristics (a gauge factor, a gauge factor temperature coefficient TCS, and a temperature coefficient of resistance TCR) can be improved.

For example, when the resistor 30 is the Cr composite film, in a case of providing the functional layer 20, the resistor 30 can be formed with α-Cr (alpha-chromium) as the main component. Since α-Cr has a stable crystalline phase, the stability of the gauge characteristics can be improved.

Here, a main component means that a target substance has 50% by weight or more of total substances that constitute the resistor. When the resistor 30 is the Cr composite film, the resistor 30 preferably includes α-Cr of 80% by weight or more, from the viewpoint of improving the gauge characteristics. Note that α-Cr is Cr having a bcc structure (body-centered cubic structure).

Also, by diffusing a metal (e.g., Ti) that constitutes the functional layer 20 into the Cr composite film, the gauge characteristics can be improved. Specifically, the gauge factor of the strain gauge 1 can be 10 or more, as well as the gauge factor temperature coefficient TCS and temperature coefficient of resistance TCR being able to be each in the range of from −1000 ppm/° C. to +1000 ppm/° C.

Note that the expansion coefficient of the substrate 10 is preferably between 7 ppm/K and 20 ppm/K, from the viewpoint of reducing warp in the substrate 10, where the internal stress of the resistor 30 is assumed to be close to zero. The expansion coefficient of the substrate 10 can be adjusted by, for example, selecting the material of the substrate 10, selecting the material of the filler contained in the substrate 10, adjusting the content, and the like.

When the resistor 30 is formed above the substrate 10, pinholes may be generated in the resistor 30. If the number of pinholes generated in the resistor 30 exceeds a predetermined value, the gauge characteristics might deteriorate, or the resistor might not serve as a strain gauge. The inventors have recognized that one of causes of a pinhole being generated in the resistor 30 relates to filler protruding from the upper surface 10a of the substrate 10.

In other words, when the substrate 10 includes a filler, a portion of the filler protrudes from the upper surface 10a of the substrate 10, and thus surface unevenness on the upper surface 10a of the substrate 10 increases. As a result, the number of pinholes that are generated in the resistor 30 formed above the upper surface 10a of the substrate 10 increases, which results in deter oration of the gauge characteristics, and the like.

The inventors have found that the number of pinholes generated in the resistor 30 can be suppressed and can maintain the gauge characteristics when the thickness of the resistor 30 is 0.05 μm or more and the surface unevenness of the upper surface 10a of the substrate 10 is 15 nm or less.

In other words, when the thickness of the resistor 30 is 0.05 μm or more, the surface unevenness on the upper surface 10a of the substrate 10 is preferably 15 nm or less, from the viewpoint of reducing the number of pinholes that are generated in the resistor 30 formed above the upper surface 10a of the substrate 10 to maintain the gauge characteristics. When the surface unevenness is 15 nm or less, even in a case where the substrate 10 includes fillers, the gauge characteristics do not deteriorate. Note that the surface unevenness on the upper surface 10a of the substrate 10 may be 0 nm.

The surface unevenness on the upper surface 10a of the substrate 10 can be reduced by, for example, heating the substrate 10. Alternatively, instead of heating of the substrate 10, a method of scraping a protrusion by approximately vertically irradiating the upper surface 10a of the substrate 10 with laser light, a method of cutting a protrusion by moving a water cutter or the like to be parallel to the upper surface 10a of the substrate 10, a method of polishing the upper surface 10a of the substrate 10 with a grinding wheel, a method of pressing the substrate 10 while heating (heat press); or the like, may be used.

Note that the surface unevenness means arithmetical mean roughness, and is generally expressed by Ra. The surface unevenness can be measured by, for example, three-dimensional optical interferometry.

The terminal sections 41 extend from both end portions of the resistor 30, and are each wider than the resistor 30 to be formed in an approximately rectangular shape, in a plan view. The terminal sections 41 are a pair of electrodes for externally outputting a change in a resistance value of the resistor 30 in accordance with strain, where, for example, a lead wire for an external connection, or the like is joined. For example, the resistor 30 extends from one of the terminal sections 41, with zigzagged hairpin turns, to be connected to another terminal section 41. The upper surface of each terminal section 41 may be coated with a metal allowing for greater solderability than the terminal section 41. Note that for the sake of convenience, the resistor 30 and the terminal sections 41 are expressed by different numerals. However, the resistor and the terminal sections can be integrally formed of the same material, in the same process.

The cover layer 60 is an insulating resin layer, which is disposed on and above the upper surface 10a of the substrate 10, such that the resistor 30 is coated and the terminal sections 41 are exposed. With the cover layer 60 being provided, mechanical damage, and the like can be prevented from occurring in the resistor 30. Additionally, with the cover layer 60 being provided, the resistor 30 can be protected against moisture, and the like. Note that the cover layer 60 may be provided to cover all portions except for the terminal sections 41.

The cover layer 60 can be formed of an insulating resin such as a PI resin, an epoxy resin, a PEEK resin, a PEN resin, a PET resin, a PPS resin, or a composite resin (e.g., a silicone resin or a polyolefin resin). The cover layer 60 may contain fillers or pigments. The thickness of the cover layer 60 is not particularly restricted, and can be appropriately selected for any purpose. For example, the thickness can be approximately between 2 μm and 30 μm.

Figure 8:
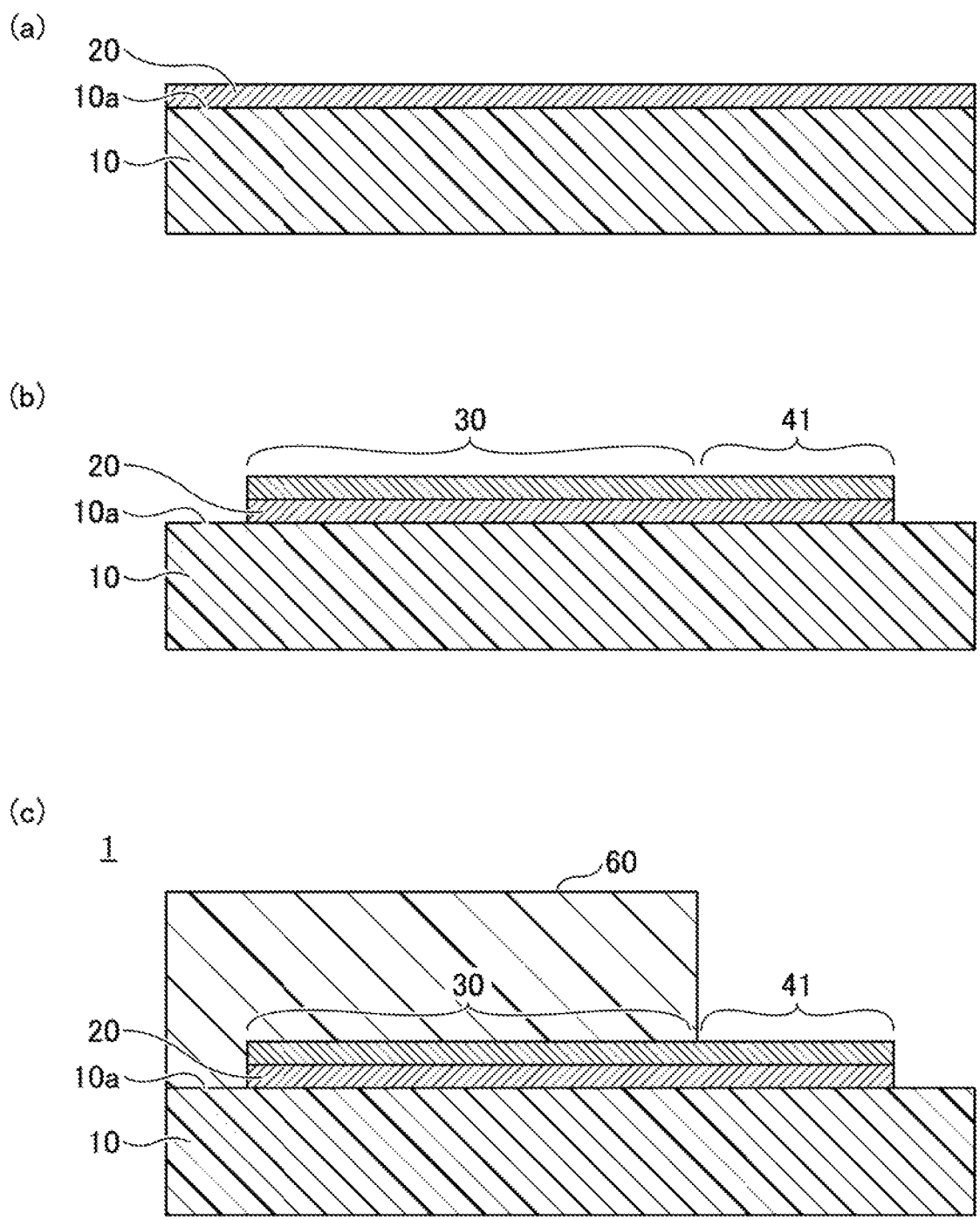
FIG. 8 is a cross-sectional view of an example of the strain detecting element in a process of manufacturing the switch according to the embodiment.

FIG. 8 is a diagram illustrating an example of a process of manufacturing the strain gauge according to the present embodiment, illustrating a cross section corresponding to FIG. 7. In order to manufacture the strain gauge 1, first, in the process illustrated in FIG. 8(*a*), the substrate 10 is prepared and the functional layer 20 is formed on the upper surface 10a of the substrate 10. The material and thickness for each of the substrate 10 and the functional layer 20 are the same as the material and thickness described above.

The functional layer 20 can be vacuum-deposited by, for example, conventional sputtering in which a raw material capable of forming the functional layer 20 is a target and in which an Ar (argon) gas is supplied to a chamber. By using conventional sputtering, the functional layer 20 is deposited while the upper surface 10a of the substrate 10 is etched with Ar. Thus, a deposited amount of film of toe functional layer 20 is minimized and thus an effect of improving adhesion can be obtained.

However, this is an example of a method of depositing the functional layer 20, and the functional layer 20 may be formed by other methods. As such a method, for example, before depositing the functional layer 20, the upper surface 10a of the substrate 10 is activated by plasma treatment using Ar, etc. or the like to thereby obtain the effect of improving the adhesion; subsequently, the functional layer 20 may be vacuum-deposited by magnetron sputtering.

Next, in the process illustrated in FIG. 8(b), the resistor 30 and the terminal sections 41 are formed on the entire upper surface of the functional layer 20, and then the functional layer 20, the resistor 30, and the terminal sections 41 are each patterned in the planar shape as illustrated in FIG. 6, by photolithography. The material and thickness for each of the resistor 30 and the terminal sections 41 are the same as the material and thickness described above. The resistor 30 and the terminal sections 41 can be integrally formed of the same material. The resistor 30 and the terminal sections 41 can be deposited by, for example, magnetron sputtering in which a raw material capable of forming the resistor 30 and the terminal sections 41 is the target. Instead of the magnetron sputtering, the resistor 30 and the terminal sections 41 may be deposited by reactive sputtering, vapor deposition, arc ion plating, pulsed laser deposition, or the like.

A combination of the material of the functional layer 20 and the material of the resistor 30 and the terminal sections 41 is not particularly restricted, and can be appropriately selected for any purpose. For example, Ti is used for the functional layer 20, and a Cr composite film formed with α-Cr (alpha-chromium) as the main component can be deposited as the resistor 30 and the terminal sections 41.

In this case, each of the resistor 30 and the terminal sections 41 can be deposited by, for example, magnetron sputtering in which a raw material capable of forming the Cr composite film is the target and in which an Ar gas is supplied to a chamber. Alternatively, the resistor 30 and the terminal sections 41 may be deposited by reactive sputtering in which pure Cr is the target and in which an appropriate amount of nitrogen gas, as well as an Ar gas, are supplied to a chamber.

In such methods, a growth face of the Cr composite film is defined by the functional layer 20 formed of Ti, and a Cr composite film that is formed with α-Cr as the main component having a stable crystalline structure can be deposited. Also, Ti that constitutes the functional layer 20 is diffused into the Cr composite film, so that the gauge characteristics are improved. For example, the gauge factor of the strain gauge 1 can be 10 or more, as well as the gauge factor temperature coefficient TCS and temperature coefficient of resistance TCR being able to be each in the range of from −1000 ppm/° C. to +1000 ppm/° C.

Note that when the resistor 30 is a Cr composite film, the functional layer 20 formed of Ti includes all functions of a function of promoting crystal growth of the resistor 30, a function of preventing oxidation of the resistor 30 caused by oxygen or moisture contained in the substrate 10, and a function of improving adhesion between the substrate 10 and the resistor 30. Instead of Ti, when the functional layer 20 is formed of Ta, Si, Al, or Fe, the functional layer also includes the same functions.

Next, in the process illustrated in FIG. 8(c), the cover layer 60 is formed on and above the upper surface 10a of the substrate 10, such that the resistor 30 is coated and the terminal sections 41 are exposed. The material and thickness of the cover layer 60 are the same as the material and thickness described above. For example, the cover layer 60 can be fabricated, such that a thermosetting insulating resin film in a semi-cured state is laminated on the upper surface 10a of the substrate 10, and such that the resistor 30 is coated therewith and the terminal sections 41 are exposed; subsequently, heat is added and curing is performed. The cover layer 60 may be formed, such that a thermosetting insulating resin that is liquid or paste-like is applied to the upper surface 10a of the substrate 10, and such that the resistor 30 is coated and the terminal sections 41 are exposed; subsequently, heat is added and curing is performed. In the above process, the strain gauge 1 is completed.

As described above, with the functional layer 20 being provided in the lower layer of the resistor 30, the crystal growth of the resistor 30 can be promoted and thus the resistor 30 having a stable crystalline phase can be fabricated. As a result, with respect to the strain gauge 1, the stability of the gauge characteristics can be improved. Also, the material that constitutes the functional layer 20 is diffused into the resistor 30, so that the gauge characteristics of the strain gauge 1 can be thereby improved.

An example of the strain gauge has been described above. However, other strain gauges can be adopted. For example, although the configuration in which the functional layer 20 and the resistor 30 are laminated is provided as described above, it is not limiting. A strain gauge having only the resistor 30 may be used. A strain gauge formed of material other than the material described above may be also used.

Figure 9:
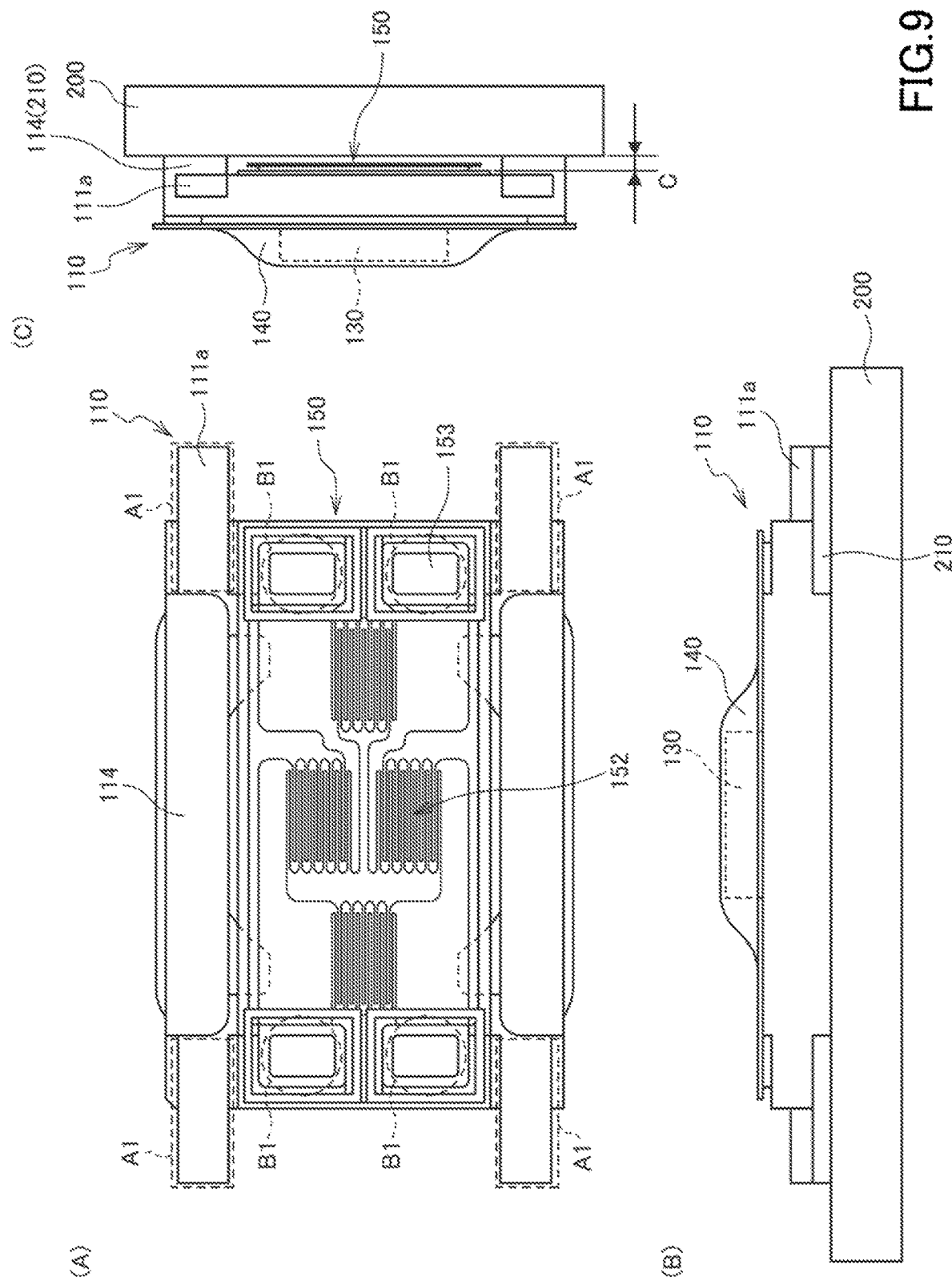
FIG. 9 relates to a lower surface-side plan view (A), a long side view (B), and a short side side view (C) of an example of the switch when mounted according to the embodiment.

FIG. 9(A) is a lower surface-side plan view of an example of the switch when mounted according to the present embodiment. FIG. 9(B) is a long side side view of the switch. FIG. 9(C) is a short side side view of the switch. In FIG. 9(A), illustration of the mounting board 200 is omitted for the sake of explanation. The push switch 100 according to the present embodiment is connected and secured to the mounting board 200 by solder or the like, at the terminals 111a of the base 110 and the terminals 153 of the strain detecting element 150. Although the mounting board 200 has a configuration in which a conductive pattern as formed on an insulating substrate, illustration of the conductive pattern is omitted in the drawing. Each terminal 111a in a region surrounded by a given dashed line A1 in FIG. 9(A) is secured to the mounting board 200 via a solder layer 210. In the present embodiment, since signals are not transmitted and received via the terminals 111a of the base 110, the terminals 111a may not be electrically connected to the mounting board. For this reason, each terminal 111a may be secured to the mounting board 200 by laser fixing or the like, without using solder. For the strain detecting element 150, each terminal 153 in a region surrounded by a given dashed line B1 is secured to the mounting board 200 with the solder layer, and is electrically connected concurrently. Each terminal 153 is connected to a measurement system via the mounting board 200, and a resistance value or the like for each of the strain gauges 152 that is provided on the strain detecting element 150 is detected. As illustrated in FIG. 9(C), the lower surface of each protruding portion 114 is provided so as to be in contact with the mounting board 200, and a clearance C is formed between the surface, which is the lower surface (the other surface) of the base 110, and the mounting board 200. For this reason, the strain detecting element 150 has a structure that does not contact the mounting board 200.

Figure 10:
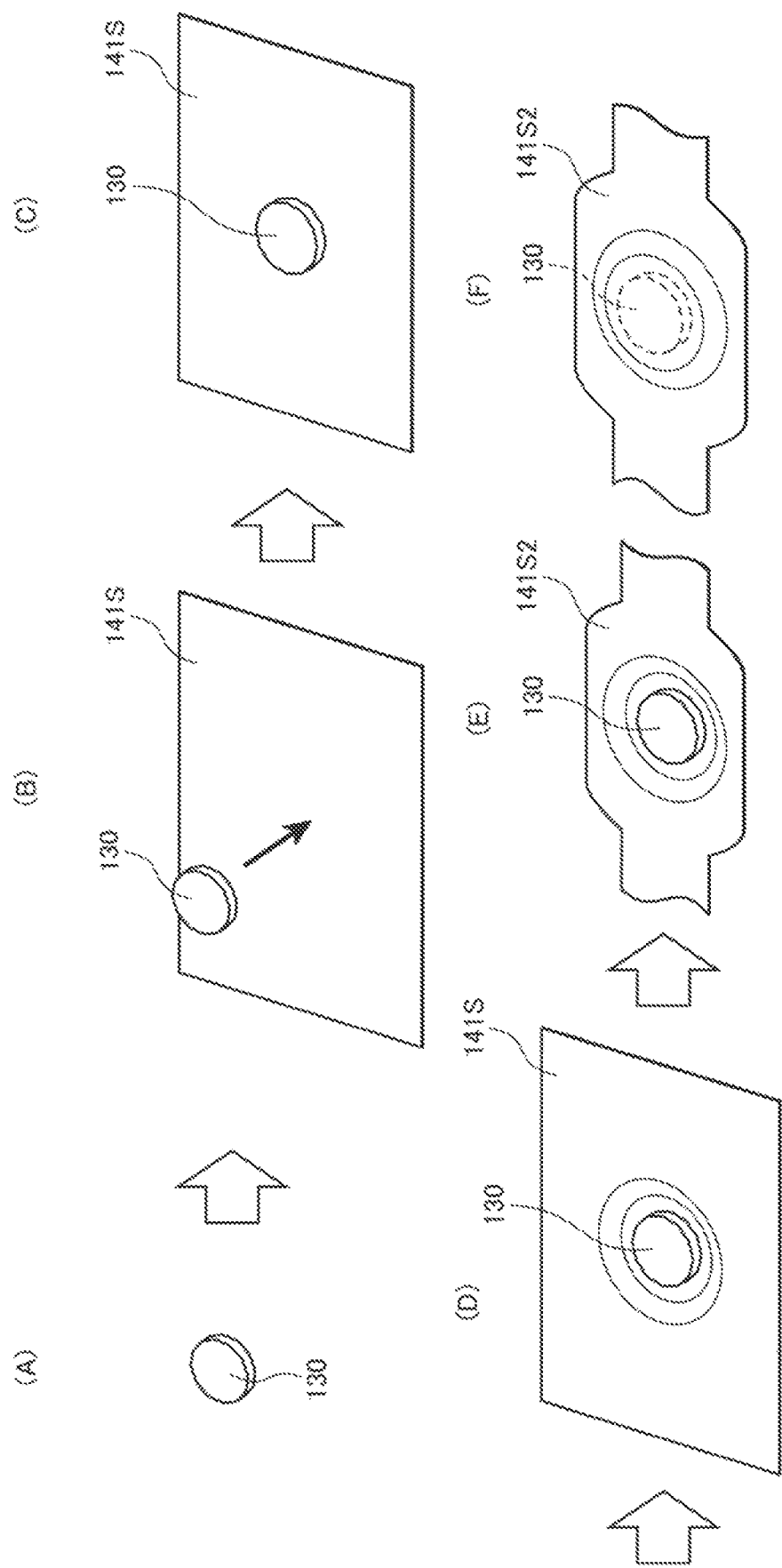
FIG. 10 is a perspective view of an example of an actuator and a cover in the process of manufacturing the switch according to the embodiment.

Hereafter, a method of manufacturing the push switch 100 according to the present embodiment will be described. FIG. 10 is a perspective view of an example of the actuator and the cover in the process of manufacturing the switch according to the present embodiment. First, as illustrated in FIG. 10(A), the actuator 130 is formed by punching a resin film such as a polyamide resin.

Then, as illustrated in FIG. 10(B), the actuator 130 is mounted on a cover 141S formed of a resin film such as a polyamide resin, and the actuator 130 is secured by laser welding, so that the actuator becomes in a state illustrated in FIG. 10(C).

Then, as illustrated in FIG. 10(D), the cover 141S is processed by raising, so that the actuator 130 becomes in a state of being depressed toward the cover 141S by a thickness of the actuator.

Then, as illustrated in FIG. 10(F), the cover 141S is processed by punching, so that the cover 141S2 becomes in a state of the respective pieces being jointed with respect to one dimension. FIG. 10(F) is a perspective view of the surface opposite to the surface view in FIG. 10(E).

Figure 11:
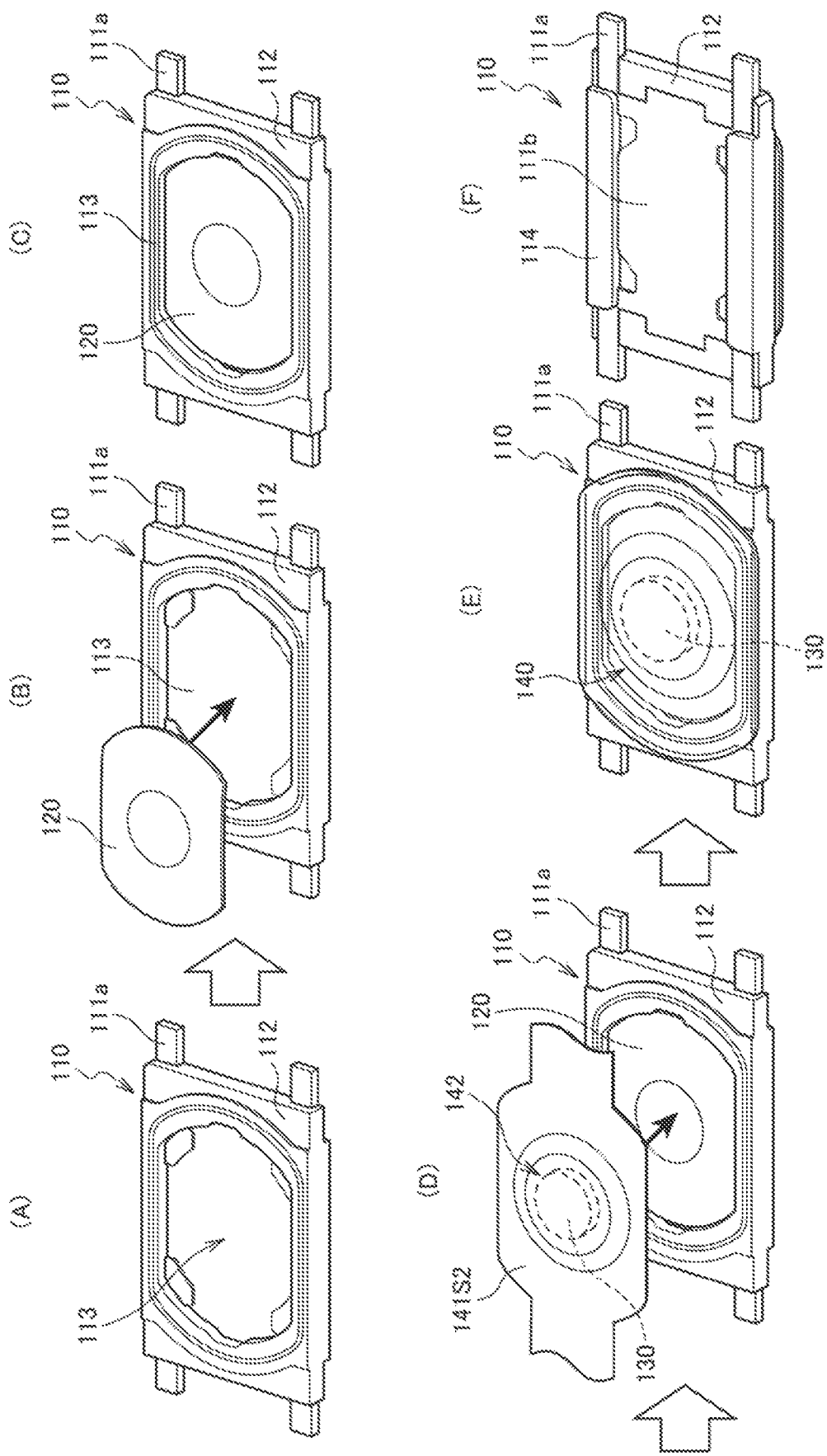
FIG. 11 is a perspective view of an example of the switch in the process of manufacturing the switch according to the embodiment.

Then, the base 110 illustrated in FIG. 11(A) is formed by insert molding. In other words, the conductive body 111 with the terminals 111a is disposed in an interior of a forming mold, and a mold resin is applied to the interior of the mold to form the resin portion 112. The recessed portion 113 is formed on one surface of the base 110 during insert molding.

Then, as illustrated in FIG. 11(B), the dome-shaped click spring 120, which is preformed in another process, is inserted into the recessed portion 113 of the base 110, such that the bottom of the recessed portion 113 is contacted at the dome-shaped opening side of the click spring. The click spring becomes in a state illustrated in FIG. 11(C) accordingly. The click spring 120 is formed such that, for example, a stainless steel sheet is formed to have a curved surface corresponding to a dome shape, and then is punched into a predetermined shape.

Then, as illustrated in FIG. 11(D), the cover 141S2 is aligned such that the actuator 130 is positioned just above the top of the click spring 120. The cover 141S2 is disposed above the base 110 accordingly.

Then, as illustrated in FIG. 11(F), the base 110 is secured by laser welding, such that the cover 141S2 covers the recessed portion 113. An unwanted portion of the cover 141S2 is removed to be processed into a geometry of the cover 140. FIG. 11(F) is a perspective view of the surface opposite to the surface view in FIG. 11(F). On the other surface of the base 110, the other surface 111b of the conductive body 111 is exposed. Further, as a portion of the resin portion 112 that constitutes part of the base 110, a pair of protruding portions 114 is provided along a pair of opposing long sides of the base 110 having the approximately rectangular shape.

Figure 12:
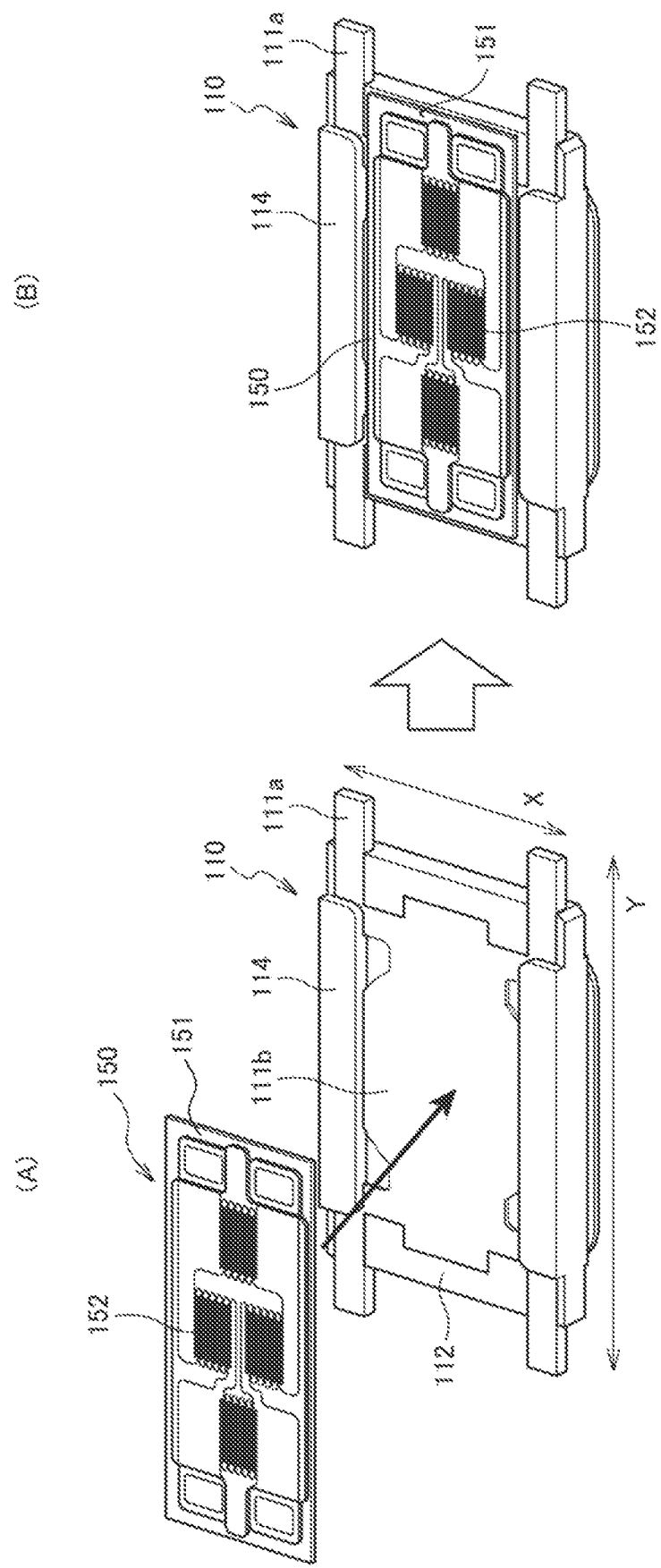
FIG. 12 is a perspective view of an example of the switch in the process of manufacturing the switch according to the embodiment.

Then, as illustrated in FIG. 12(A), positioning of the strain detecting element 150, which is preformed in another process, is performed with respect to the other surface 111b of the base 110. Then, the strain detecting element 150 adheres to the other surface 111b of the base 110, with an adhesive or the like, so that the strain detecting element becomes in a state illustrated in FIG. 12(B). The positioning of the strain detecting element 150 with respect to the direction (X direction), which is along the short sides of the approximately rectangular shaped base 110, is performed by positioning of the outer periphery of the strain detecting element 150 with respect to the inner wall surfaces of the grooves, each of which is constituted by part of a given protruding portion 114. Each of given end portions of the element substrate 151 of the strain detecting element 150 can be disposed so as to contact a given inner wall surface of the groove that is constituted by part of the protruding portion 114. Alternatively, the element substrate may be disposed such that a distance between the inner wall surface of the groove, which is constituted by part of a given protruding portion 114, and a given end portion of the element, substrate 151 is a predetermined value. Further, the positioning of the strain detecting element 150 with respect to the direction (Y direction), which is along the long sides of the approximately rectangular shaped base 110, can be performed as appropriate. For example, a protruding shape not illustrated is formed in the strain detecting element 150, a recessed shape to fit into the protruding shape is formed in the base 110, and the protruding shape fits into the recessed shape. In such a manner, positioning may be performed with respect to the Y direction.

The push switch according to the present embodiment described above has the configuration in which the strain detecting element is attached to the other surface of the base, and such a push switch can be easily manufactured. The push switch further provides the advantage described below.

Although conventional input devices that detect strain to operate are electrically conductive, they do not provide an operational feel. For this reason, there is a problem that the operational feel cannot be provided to a user. In particular, when a force is not smoothly applied to the strain detecting unit, the output of the strain detecting unit may become unstable. One of the causes for the unstable output is that positional accuracy of the strain detecting unit and a location at which the force is applied, is not secured sufficiently, which may result in an unstable performance.

By accurately adjusting the position of the strain detecting element 150 with respect to the base 110, as described above, the push switch according to the present embodiment can have the configuration in which the strain detecting element 150 can be provided directly beneath a portion of the click spring 120 to be depressed. Further, with the conductive body 111 being formed of a ductile material, strain occurring in the base 110 having the conductive body 111 can be effectively transferred to the strain detecting element 150.

When a gap occurs between a click point of the switch and an output point of the strain sensor, there is a problem that the operational feel cannot be stably provided to the user. For the push switch according to the present embodiment, the configuration described above causes the click point at which the click spring 120 is depressed to easily match a position (detection point of the sensor) where the detection amount of the sensor that is the strain detection element rises, so that stability of the operational feel can be improved. Further, when the switch is depressed after the click point, linear output (linear power) with respect to the depression amount of the click spring 120 can be detected, as the output of the strain detecting element 150.

The push switch according to the present embodiment has the function of providing an operational feel, and can detect the linear power by detecting the strain. By embedding the click spring, the operational feel is improved. Further, without using electric conduction through the contact of the switch, natural output data is acquired from each strain gauge, thereby enabling an additional function to be provided in addition to an on-off function.

In the above configuration, the planar surface of a ductile material where the grooves are provided at a bottom portion (the other surface of the base 110) of the switch, is disposed, and the strain sensor is attached to the planar surface. The strain detecting element is secured. The bottom portion (the other surface of the base 110) of the switch has a structure of supporting the spring at both ends of the switch. Attachment can be achieved along the grooves provided at the bottom portion (the other surface of the base 110) of the switch, and the effect of preventing rattling in the switch, as well as preventing an adhesive from sticking out during manufacturing, is obtained, thereby improving workability in the manufacturing process. With such a structure of supporting the spring at both ends of the switch, strain with respect to the ductile material can be smoothly transferred to the sensor, thereby being able to stabilize the output.

There is a problem that moisture enters an interior of switches. It is considered that moisture enters the interior of switches through a gap caused by a difference in coefficient of thermal expansion between the conductive body and the resin portion, which constitute part of the base. Further, as described in Patent document 4, when the base is formed by insert molding, it is known that, by molding the base with resin in a state in which a plurality of pins support a conductive body within a mold for insert molding, moisture enters the interior of the switch through the holes that can be formed at a resin portion that is molded using the pins that are moved. For the conventional switches having a general function of being electrically conductive, complete waterproof is difficult to provide as a single body. For the push switch according to the present embodiment, without including any contact that becomes in a state of being electrically conductive in response to depressing the click spring 120, the strain sensor detects an on or off of the switch. The strain sensor is totally waterproof, thereby enabling the switch to be totally waterproof with providing an operational feel.

For the conventional switch, due to repeated use of the switch, the click spring embedded in the switch may be broken, or contact resistance at a portion of the click spring, or the like may increase. The push switch according to the present embodiment has the configuration that does not have any contact that becomes in a state of being electrically conductive in response to depressing the click spring 120, and the push switch has a function of detecting a timing at which the switch is turned on, through the strain sensor. By actualizing detection by the strain sensor, the configuration that does not have any contact that becomes in a state of being electrically conductive, can be provided. Flexibility of a structure design for the click spring that is provided in the interior of the switch is enhanced, and stress on the click spring can be reduced. Breakage is prevented and thus the lifetime of the switch increases. Further, there is no need to ensure the state of being electrically conductive through the click spring, thereby improving the stability with respect to contact resistance for the click spring.

Figure 13:
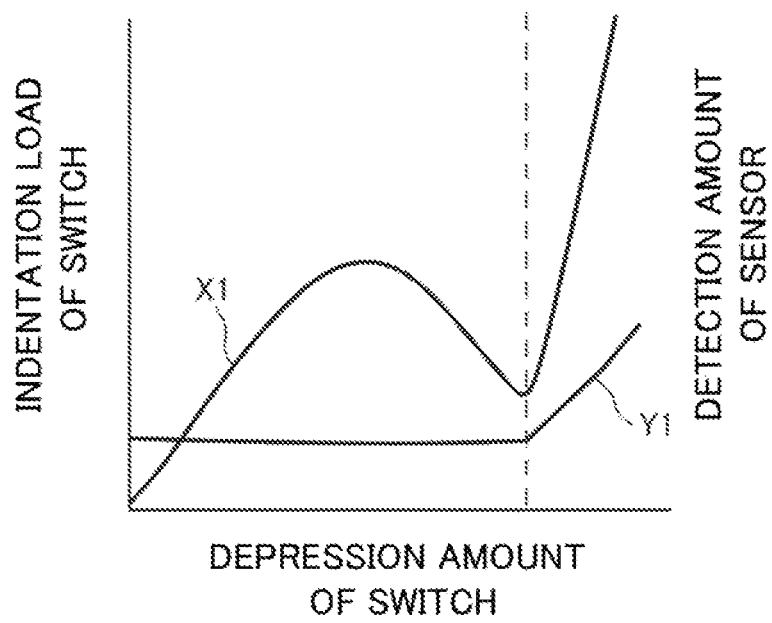
FIG. 13 is a diagram illustrating, with respect to a depression amount of the switch, an indentation load of the switch and a detection amount of a sensor, in an example of the switch according to the embodiment.

FIG. 13 is a diagram illustrating, with respect to a depression amount of the switch, an indentation load of the switch and a detection amount of the sensor in an example of the switch according to the present embodiment. The horizontal axis represents the depression amount of the switch, and the vertical axis represents the indentation load of the switch and the detection amount of the sensor. The X1 expresses the indentation load of the switch The Y1 expresses the detection amount of the sensor. The indentation load of the switch increases as the depression amount of the switch increases. When the indentation load of the switch exceeds a predetermined value, the center portion of the click spring is inverted with a click feeling, so that the indentation load of the switch is temporarily reduced. Such a point corresponds to the click point. Further, when the depression amount of the switch increases, the indentation load of the switch increases again. In contrast, the detection amount of the sensor is not increased until after the depression amount of the switch reaches a predetermined value. When the depression amount of the switch exceeds the predetermined value, the detection amount of the sensor increases linearly as the depression amount of the sensor increases. In the switch according to the present embodiment, the surface of the ductile material is disposed at the bottom portion (the other surface) of the switch, and the strain sensor is attached to such a surface, so that the switch has the structure in which linear power can be detected. By matching the click point of a switch unit with a detection point (point at which the detection amount of the sensor rises) of a strain sensor, inconsistency between an operational feel and an actually functional operation is avoided, and thus the stability of the operational feel is improved.

Modification

Figure 14:
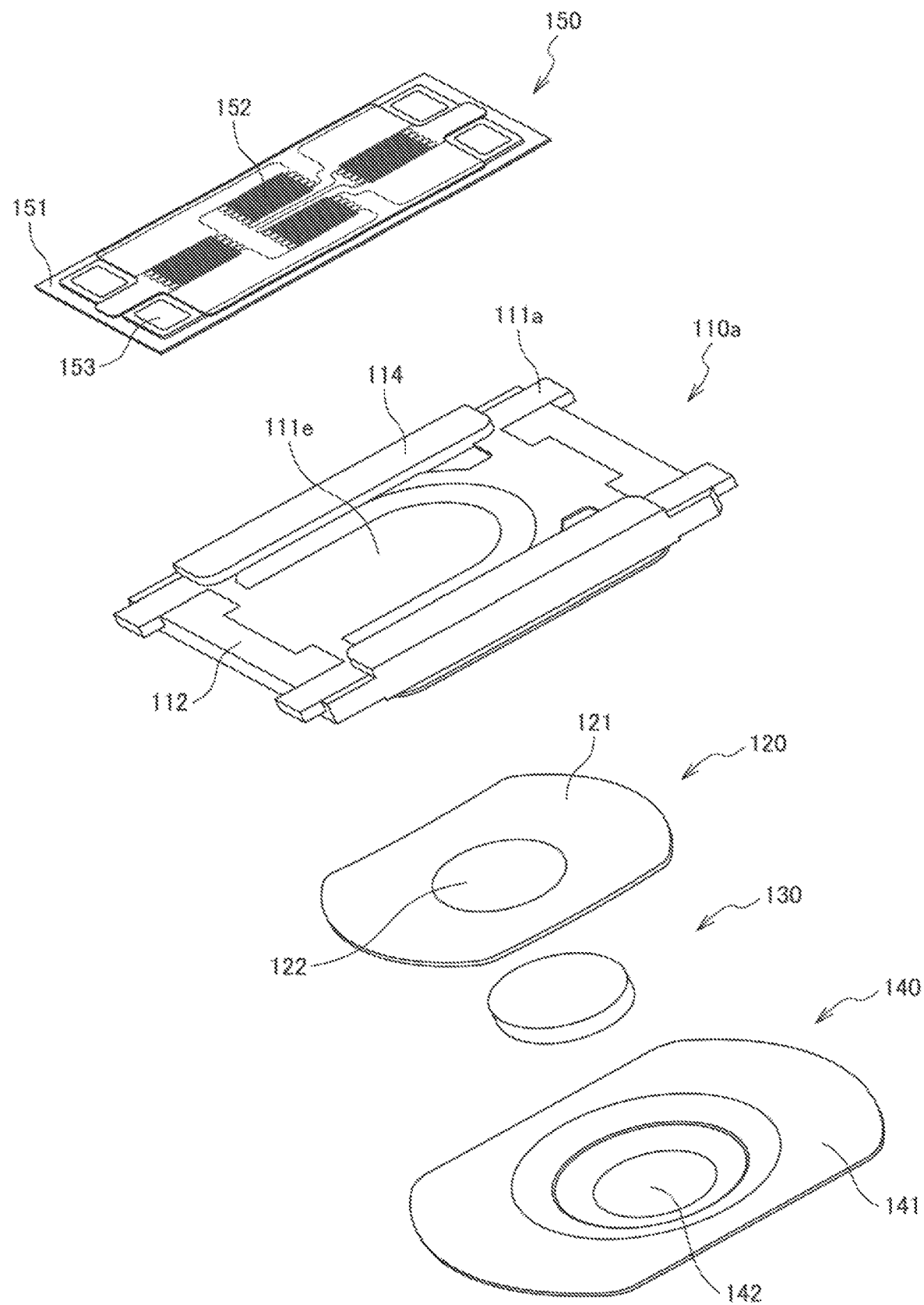
FIG. 14 is an exploded perspective view of an example of the switch according to modification.

FIG. 14 is an exploded perspective view of an example of the push switch according to modification. The push switch has a base 110a, the click spring 120, the actuator 130, the cover 140, and the strain detecting element 150. The modification differs in the configuration of the base from the embodiment described in FIG. 1.

Figure 15:
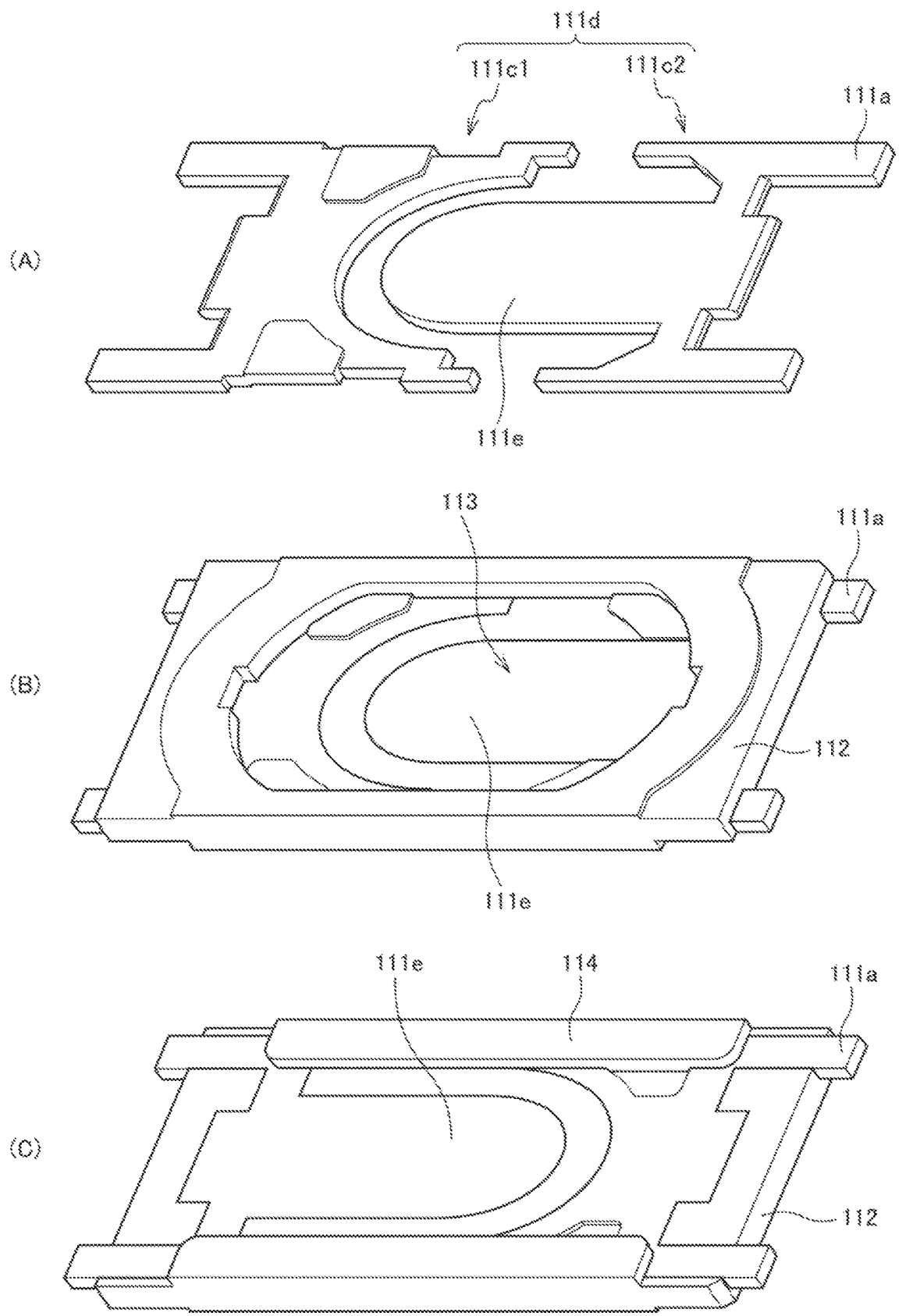
FIG. 15 is a perspective view of an example of a base of the switch according to the modification.

The base 110a will be described. FIG. 15 is a perspective view of an example of the configuration of the base of the switch according to the present embodiment. FIG. 15(A) is a perspective view of a conductive body 111d included in the base 110. The conductive body 111d includes a first conductive body 111c1 having an approximately plate shape, and includes a second conductive body 111c2 provided apart from the first conductive body 111c1. Each of the first conductive body 111c1 and the second conductive body 111c2 is provided with respective terminals situated at two locations. In the second conductive body 111c2, an extending portion 111e that extends toward the first conductive body 111c1 is formed. The first conductive body 111c1 has a recessed shape suitable for the shape of the extending portion 111e, such that the first conductive body 111c1 and the second conductive body 111c2 do not contact each other.

FIG. 15(B) is an upper surface-side perspective view of the base 110a. By insert molding, the conductive body 111d (first conductive body 111c1 and second conductive body 111c2) is formed integrally with the resin portion 112. On one surface (upper surface) of the base 110a, the recessed portion 113 of which the bottom is the upper surface of the extending portion 111e of the second conductive body 111c2, and of which sidewalls are constituted by part of the resin portion 112.

FIG. 15(C) is a lower surface-side perspective view of the base 110a. The resin portion 112 is provided such that the other surface of the extending portion 111e of the second conductive body 111c2 is exposed. As a portion of the resin portion 112, a pair of protruding portions 114 is provided along a pair of opposing long sides of the approximately rectangular shaped base 110a, on the other surface of the base 110a. Except for the above configuration, the same configuration as the push switch according to the above embodiment is provided. The push switch according to the modification has the configuration in which the strain detecting element is attached to the other surface of the base, and such a push switch can be easily manufactured.

In the base 110a of the push switch according to the modification, the first conductive body 111c1 and the second conductive body 111c2 are apart from each other to be insulated through the resin portion 112. Each of the first conductive body 111c1 and the second conductive body 111c2 serves as a fixing contact. In contrast, the click spring 120 serves as a movable contact. An end portion of toe click spring 120 is in contact with the first conductive body 111c1, regardless of depression of the click spring 120. The click spring 120 does not contact the second conductive body 111c2 when the click spring 120 is not depressed. The user depresses the switch to thereby be able to depress the actuator 130 directly or indirectly via the cover 140. When the actuator 130 is depressed, the top of the dome shape at the center portion of the click spring 120, which is disposed below the actuator 130, is depressed. When the load exceeds a predetermined value, the center portion is inverted with a click feeling, so that the center portion becomes in a state of being recessed downward. In this case, the back of the central portion of the click spring 120 contacts the extending portion 111e of the second conductive body 111c2. Thereby, the first conductive body 111c1 and the second conductive body 111c2 are electrically connected to each other via the click spring 120. By detecting electrical connection between the first conductive body 111c1 and the second conductive body 111c2, an on state or an off state of the push switch is identified.

In the push switch according to the modification, when the load at the center portion of the click spring 120 exceeds a predetermined value, the center portion is inverted with a click feeling. Subsequently, after the center portion becomes in a state of being recessed downward, strain occurs in the base 110a due to a force to depress the base 110a, and thus the strain sensor starts actualizing detection. When the depression amount of the click spring 120 in accordance with the depression increases, the force to depress the base 110a increases accordingly, which results in an increase in strain of the base 110. Accordingly, the detection amount of the sensor is increased.

According to the modification, as described above, the recessed portion 113 of the base 110a includes the contacts each of which becomes in a state of being electrically conductive in response to depressing the click spring 120. Through the contact becoming conductive, the on state or the off state of the switch is identified. Further, a multi-stage switch that can detect the depression amount of the switch based on the output of the strain sensor, is provided.

Figure 16:
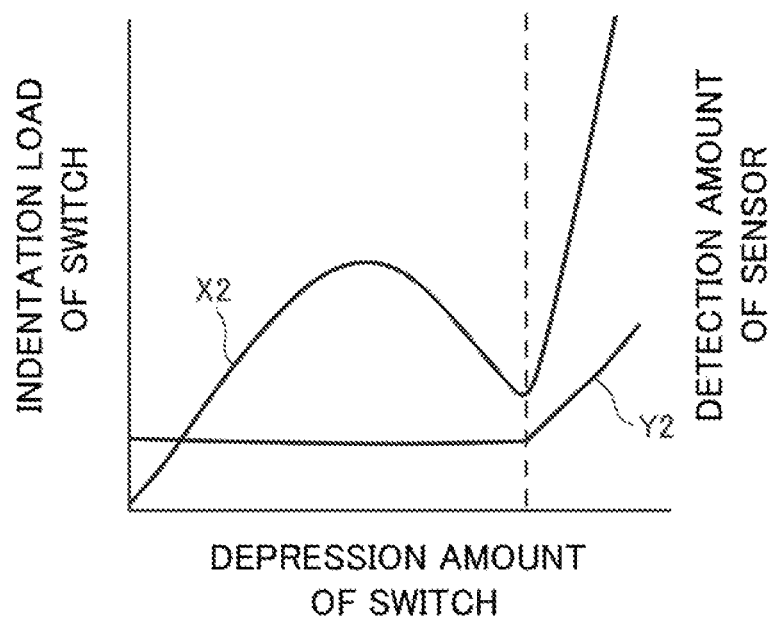
FIG. 16 is a diagram illustrating, with respect to the depression amount of the switch, the indentation load of the switch and the detection amount of the sensor, for the switch according to the modification.

FIG. 16 is a diagram illustrating, with respect to the depression amount of the switch, the indentation load of the switch and the detection amount of the sensor for the switch according to the modification. The horizontal axis represents the depression amount of the switch. The vertical axis represents the indentation load of the switch and the detection amount of the sensor. The X2 expresses the indentation load of the switch. The Y2 expresses the detection amount of the sensor. The indentation load of the switch increases as the depression amount of the switch increases. When the indentation load of the switch exceeds a predetermined value, the center portion of the click spring is inverted with a click feeling, so that the indentation load of the switch is temporarily reduced. Such a point corresponds to the click point, and the fixing contacts and the movable contact are electrically connected to each other. Further, when the depression amount of the switch increases, the indentation load of the switch increases again. In contrast, the detection amount of the sensor is not increased until after the depression amount of the switch reaches a predetermined value. Subsequently, after the depression amount of the switch exceeds the predetermined value, the detection amount of the sensor increases linearly as the depression amount of the sensor increases.

According to the modification, as a strain generating body to which the strain sensor is attached, the base having a switching structure is used. The base having the switching structure includes the fixing contacts and the movable contact. The fixing contacts and the movable contact become in a state of being connected together or a state of being disconnected from each other, in accordance with the depression amount of the switch. Accordingly, the switch becomes in an on state or an off state. Based on the output of the strain sensor, the click point of the switch can be detected in detail. Up to a point at which the click feeling is provided, a feel through a general tactile switch is provided. After a click feeling is provided, the strain sensor outputs a certain amount of the electrical signal, thereby enabling a function of the multi-stage switch with a good operational feel to be provided. Further, after the click feeling is provided, the detection amount of the sensor can be used as the analog output, that increases in accordance with the depression amount.

The preferred embodiments have been described above. However, various modifications and alternatives to the above embodiments can be made without departing from a scope set forth in the claims. For example, a conductive material other than stainless steel can be used for the conductive layer constituting part of the base, or the click spring. An insulating resin other than a polyamide resin can be used for a resin layer constituting part of the base, an actuator, and a cover.

This application claims priority to Japanese Patent Application No. 2018-085637, filed Apr. 26, 2018 with the Japan Patent Office, the contents of which are hereby incorporated by reference in their entirety.

DESCRIPTION OF SYMBOLS 10 substrate
20 functional layer
30 resistor
41 terminal section
60 cover layer
100 push switch
110, 110a base
111 conductive body
111a terminal
111b the other surface
111c1 first conductive body
111c2 second conductive body
111d conductive body
111e extending portion
112 resin portion
113 recessed portion
114 protruding portion
120 click spring
130 actuator
140, 141S, 141S2 cover
150 strain detecting element
151 element substrate
152 strain gauge
153 terminal
200 mounting board
210 solder layer

The invention claimed is:

1. A switch comprising:
a base including a recessed portion on one surface of the base;
a click spring having a dome shape, the click spring being provided at the recessed portion such that the bottom of the recessed portion is contacted at a dome-shaped opening side of the click spring;
a cover provided to cover the recessed portion and to house the click spring at the recessed portion; and a strain detecting element attached to another surface of the base, wherein the strain detecting element is configured to detect strain of the base, the strain occurring in accordance with a depression amount of the click spring that is depressed, and output an amount of the detected strain, the amount of the detected strain increasing in accordance with an increase in the depression amount of the click spring, upon occurrence of a condition in which the amount of the detected strain exceeds a threshold.

2. The switch according to claim 1, further comprising an actuator between a top of the click spring and the cover.

3. The switch according to claim 1, wherein a pair of protruding portions of which inner wall surfaces constitute parts of respective grooves is provided on the another surface of the base, and wherein a position of the outer periphery of the strain detecting element is adjusted with respect to the inner wall surfaces of the grooves, so that the strain detecting element is positioned with respect to the base.

4. The switch according to claim 1, wherein the recessed portion does not include a contact that becomes in a state of being electrically conductive in response to depressing the click spring.

5. The switch according to claim 4, wherein an on state or an off state is identified based on the output of the strain detecting element.

6. The switch according to claim 1, wherein the recessed portion includes a contact that becomes in a state of being electrically conductive in response to depressing the click spring.

7. The switch according to claim 6, wherein the depression amount of the click spring that causes the contact to become in the state of being electrically conductive in response to depressing the click spring, matches the depression amount of the click spring that causes power of the strain detecting element to start increasing.

8. The switch according to claim 1, wherein the depression amount of the click spring that corresponds to a click point at which a center portion of the click spring is inverted in response to depressing the click spring, matches the depression amount of the click spring that causes power of the strain detecting element to start increasing.

9. A switch comprising:

a base including a recessed portion on one surface of the base;

a click spring having a dome shape, the click spring being provided at the recessed portion such that the bottom of the recessed portion is contacted at a dome-shaped opening side of the click spring;

a cover provided to cover the recessed portion and to house the click spring at the recessed portion; and a strain detecting element attached to another surface of the base, wherein the strain detecting element is configured to detect strain of the base, the strain occurring in accordance with a depression amount of the click spring that is depressed, and wherein for power of the strain detecting element, a range of linear power with respect to the depression amount of the click spring is set.

10. The switch according to claim 1, wherein material of a given base surface that is a bottom portion of the recessed portion, and that is a surface being the another surface of the base, is a ductile material.

11. The switch according to claim 1, wherein the strain detecting element is provided directly beneath a portion of the click spring that is depressed.

* * * * *